US009544991B2

(12) United States Patent
Chen et al.

(10) Patent No.: US 9,544,991 B2
(45) Date of Patent: Jan. 10, 2017

(54) MULTI-PAIR DIFFERENTIAL LINES PRINTED CIRCUIT BOARD COMMON MODE FILTER

(75) Inventors: Chung-Hao J. Chen, Portland, OR (US); Dong-Ho Han, Beaverton, OR (US); Mike Schaffer, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 621 days.

(21) Appl. No.: 13/977,537

(22) PCT Filed: Dec. 19, 2011

(86) PCT No.: PCT/US2011/065785
§ 371 (c)(1),
(2), (4) Date: Jun. 28, 2013

(87) PCT Pub. No.: WO2013/095326
PCT Pub. Date: Jun. 27, 2013

(65) Prior Publication Data
US 2013/0271909 A1     Oct. 17, 2013

(51) Int. Cl.
*H05K 1/02* (2006.01)
*H01P 1/203* (2006.01)
(Continued)

(52) U.S. Cl.
CPC ............... *H05K 1/0237* (2013.01); *G06F 1/16* (2013.01); *H01F 17/0013* (2013.01);
(Continued)

(58) Field of Classification Search
CPC ................ H01L 2223/6638; H01L 2223/6627; H01L 2924/1517; H05K 1/0245; H05K 1/0298; H05K 3/284; H05K 3/3447; H01P 1/20345; H04L 25/0276
See application file for complete search history.

(56) References Cited

U.S. PATENT DOCUMENTS 7,535,321 B1   5/2009   Degerstrom et al.
7,812,693 B1   10/2010  Acimovic
(Continued)

FOREIGN PATENT DOCUMENTS

WO    2013/095326 A1    6/2013

OTHER PUBLICATIONS

International Search Report and Written Opinion received for International Application No. PCT/US2011/065785, mailed on Aug. 31, 2012, 9 pages.
(Continued)

*Primary Examiner* — Robert J Hoffberg
*Assistant Examiner* — Hung Dang
(74) *Attorney, Agent, or Firm* — Blakely, Sokoloff, Taylor & Zafman LLP

(57) ABSTRACT

Multi-pair differential lines printed circuit board common mode filters are generally described. In one embodiment, the apparatus includes a multi-layer printed circuit board, a first signal line and a second signal line forming a first differential pair on a first layer of the printed circuit board, a second differential pair on the first layer of the printed circuit board, and a common mode filter on a second layer of the printed circuit board, the common mode filter comprising an absence of a predominantly occurring dielectric material of the printed circuit board, the common mode filter spanning an area directly below at least a portion of both the first and the second differential pairs. Other embodiments are also described and claimed.

14 Claims, 3 Drawing Sheets

(51) Int. Cl.
*H01P 3/02* (2006.01)
*G06F 1/16* (2006.01)
*H01F 17/00* (2006.01)

(52) U.S. Cl.
CPC ...... *H01P 1/20327* (2013.01); *H01P 1/20345* (2013.01); *H01P 3/026* (2013.01); *H01F 2017/0093* (2013.01)

(56) References Cited

U.S. PATENT DOCUMENTS

2007/0130555 A1* 6/2007 Osaka ............... H01L 23/49838
                                                        439/14
2010/0052820 A1   3/2010 Wu et al.
2011/0273245 A1* 11/2011 Pai .......................... H01P 3/003
                                                        333/204

OTHER PUBLICATIONS

International Preliminary Report on Patentability received for PCT Patent Application No. PCT/US2011/065785, mailed on Jul. 3, 2014, 6 pages.

* cited by examiner

MULTI-PAIR DIFFERENTIAL LINES PRINTED CIRCUIT BOARD COMMON MODE FILTER

CROSS-REFERENCE TO RELATED APPLICATION

This patent application is a U.S. National Phase Application under 35 U.S.C. §371 of International Application No. PCT/US2011/065785, filed Dec. 19, 2011, entitled MULTI-PAIR DIFFERENTIAL LINES PRINTED CIRCUIT BOARD COMMON MODE FILTER.

FIELD OF THE INVENTION

One or more embodiments of the invention relate generally to the field of interconnect. More particularly, one or more of the embodiments of the invention relates to multi-pair differential lines printed circuit board common mode filter.

BACKGROUND OF THE INVENTION

Communication between devices within a computer system may involve high speed/frequency data links. With ever increasing data rates, the radio performance can be degraded significantly due to common mode noise radiation from high speed data.

BRIEF DESCRIPTION OF THE DRAWINGS

The various embodiments of the present invention are illustrated by way of example, and not by way of limitation, in the figures of the accompanying drawings and in which.

DETAILED DESCRIPTION

In the following description, numerous specific details such as logic implementations, sizes and names of signals and buses, types and interrelationships of system components, and logic partitioning/integration choices are set forth in order to provide a more thorough understanding. It will be appreciated, however, by one skilled in the art that the invention may be practiced without such specific details. In other instances, control structures and gate level circuits have not been shown in detail in order not to obscure the invention. Those of ordinary skill in the art, with the included descriptions, will be able to implement appropriate logic circuits without undue experimentation.

In addition, although an embodiment described herein is directed to multi-pair differential line common mode filtering, it will be appreciated by those skilled in the art that the embodiments of the present invention can be applied to other systems. Other structures may fall within the embodiments of the present invention, as defined by the appended claims. The embodiments described above were chosen and described in order to best explain the principles of the embodiments of the invention and its practical applications. These embodiments were chosen to thereby enable others skilled in the art to best utilize the invention and various embodiments with various modifications as are suited to the particular use contemplated.

Figure 1:
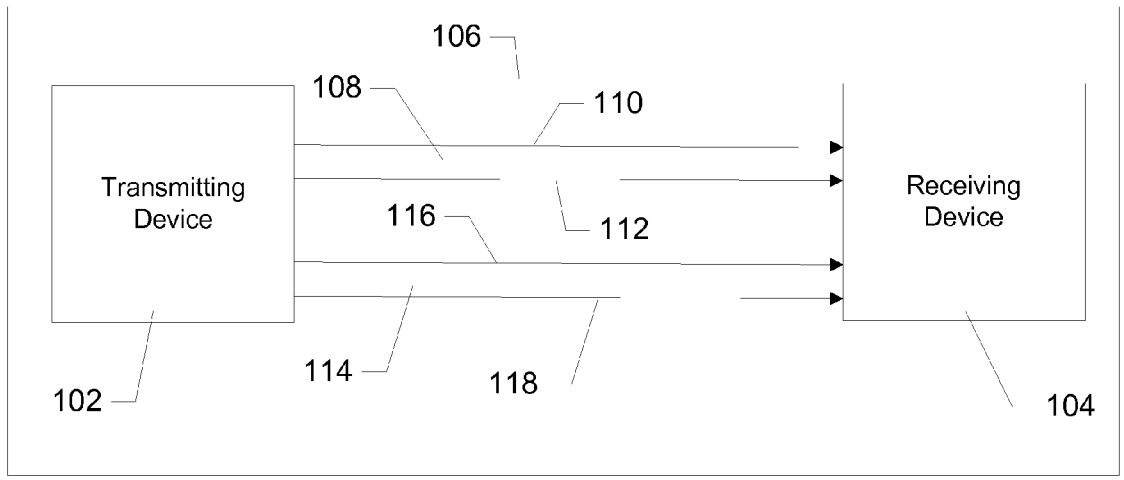
FIG. 1 is a block diagram of an example interconnect, in accordance with one example embodiment of the invention.

FIG. 1 is a block diagram of an example interconnect, in accordance with one example embodiment of the invention. As shown, system 100 includes transmitting device 102, receiving device 104, interconnect 106, first differential pair 108, first p signal 110, first n signal 112, second differential pair 114, second p signal 116, and second n signal 118.

Transmitting device 102 and receiving device 104 may represent any type of integrated circuit device. In one embodiment, transmitting device 102 may be a processor or controller and receiving device may be a memory or I/O device, for example. Transmitting device 102 and receiving device 104 may be integrated into the same platform, such as a printed circuit board, or may be incorporated into separate platforms separated by some distance.

Interconnect 106 may represent any serial bus utilizing differential pairs. In one embodiment, interconnect 106 represents Peripheral Component Interconnect (PCI) Express™. While shown as including two differential pairs, interconnect 106 may utilize any number of differential pairs.

As shown, first p signal 110 and first n signal 112 form first differential pair 108 and second p signal 116 and second n signal 118 form second differential pair 114 for transmitting device 102 to send data to receiving device 104. As known in the art, differential signaling offers advantages over single-ended signaling in high speed/frequency signaling, particularly in terms of noise immunity. In one embodiment, p signals 110 and 116 and n signals 112 and 118 comprise matching lengths and geometries, and need not be straight as shown.

Figure 2:
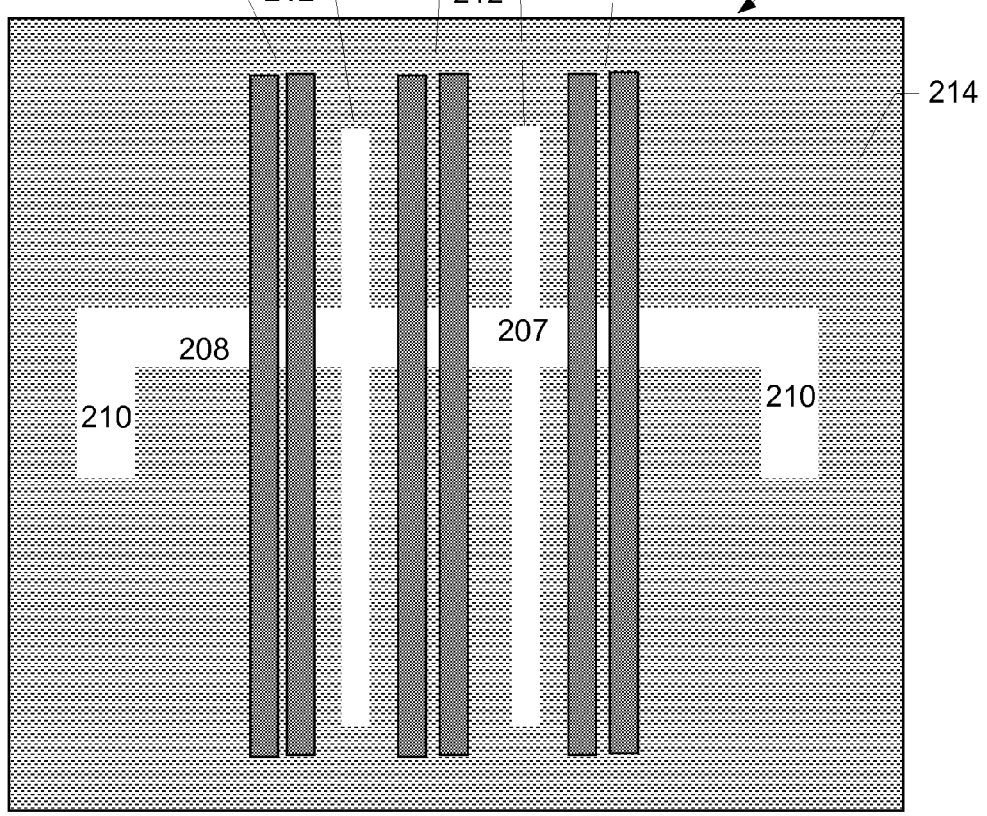
FIG. 2 is a graphical illustration of a plan view of an example multi-pair differential line common mode filtering, in accordance with one example embodiment of the invention.

FIG. 2 is a graphical illustration of a plan view of an example multi-pair differential line common mode filtering, in accordance with one example embodiment of the invention. As shown, system 200 includes differential pairs 202, 204 and 206, common mode filter 207, perpendicular filter portion 208, parallel filter portions 210, between-pair filter portions 212, and printed circuit board 214. Other components of system 200, such as transmitting and receiving devices, for example, are not shown.

Printed circuit board 214 may predominantly consist of a particular dielectric material. In one embodiment, printed circuit board 214 predominantly consists of fiberglass. Printed circuit board 214 may consist of multiple layers, for example, to accommodate signal routing, device placement, power and ground planes, etc. Differential pairs 202, 204 and 206 represent a portion of an interconnect between a transmitting and a receiving device. It should be understood that while three differential pairs are shown, additional differential pairs may be utilized. Differential pairs 202, 204 and 206 may occur on a top layer of printed circuit board 214 or on a lower layer.

Common mode filter 207 may occur partly or entirely on a different layer of printed circuit board 214 from that of differential pairs 202, 204 and 206. Common mode filter 207 may include perpendicular filter portion 208, parallel filter portions 210 and between-pair filter portions 212. Common mode filter 207 may comprise an absence of the predominantly occurring dielectric material of printed circuit board 214. In one embodiment, common mode filter 204 represents voids. In other embodiments, common mode filter 204, or portions thereof, comprise conductive or magnetic lossy material.

Figure 3:
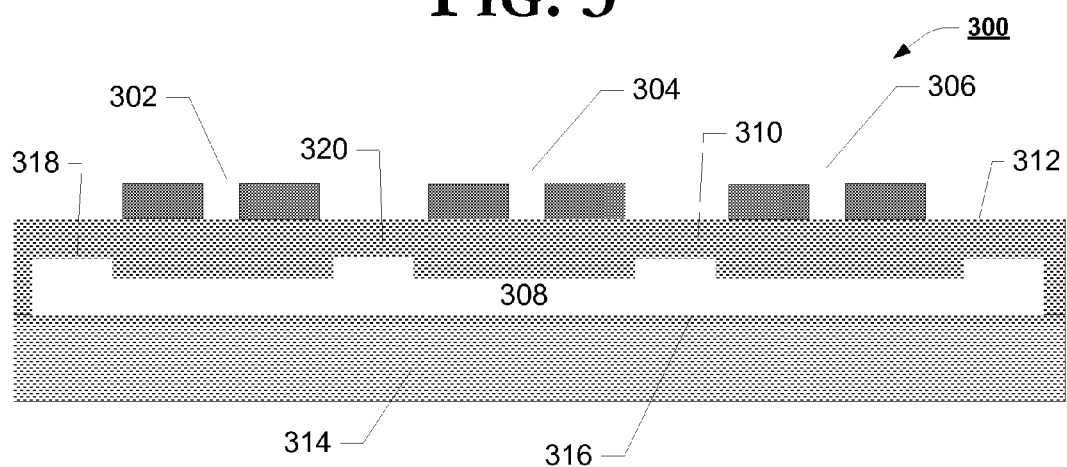
FIG. 3 is a graphical illustration of a cross-sectional view of an example multi-pair differential line common mode filtering, in accordance with one example embodiment of the invention.

FIG. 3 is a graphical illustration of a cross-sectional view of an example multi-pair differential line common mode filtering, in accordance with one example embodiment of the invention. As shown, system 300 includes differential pairs 302, 304, and 306, common mode filter 308, first PCB layer 310, first PCB layer top surface 312, second PCB layer 314, second PCB layer top surface 316, lateral filter portions 318, and between-pair filter portions 320. While shown as including two layers, system 300 may include a multi-layer printed circuit board having three or more layers.

While differentials pairs 302, 304 and 306 are shown on first PCB layer top surface 312, differential pairs 302, 304 and 306 may be under first PCB layer top surface 312 or on or under another layer of system 300 or another layer not shown. Also, while common mode filter 308 is shown on second PCB layer top surface 316, common mode filter 308 may be under second PCB layer top surface 316 or on or under another layer of system 300. In one embodiment, first PCB layer 310 is a top layer used primarily for component placement and signal routing and second PCB layer 314 is an internal layer used primarily for power or ground planes.

Common mode filter 308 spans an area directly below at least a portion of each of differential pairs 302, 304 and 306. As shown, common mode filter 308 includes raised lateral filter portions 318, below a space outside differential pairs 302, 304 and 306, and raised between-pair filter portions 320, below a space between differential pairs 302, 304 and 306, however these raised filter portions need not be present in all embodiments. In one embodiment, common mode filter 308 comprises an absence of a predominantly occurring dielectric material of first PCB layer 310, such as, for example, a void. In another embodiment, common mode filter 308 comprises magnetic or conductive lossy material. In another embodiment, common mode filter 308 comprises an alternative dielectric material.

Figure 4:
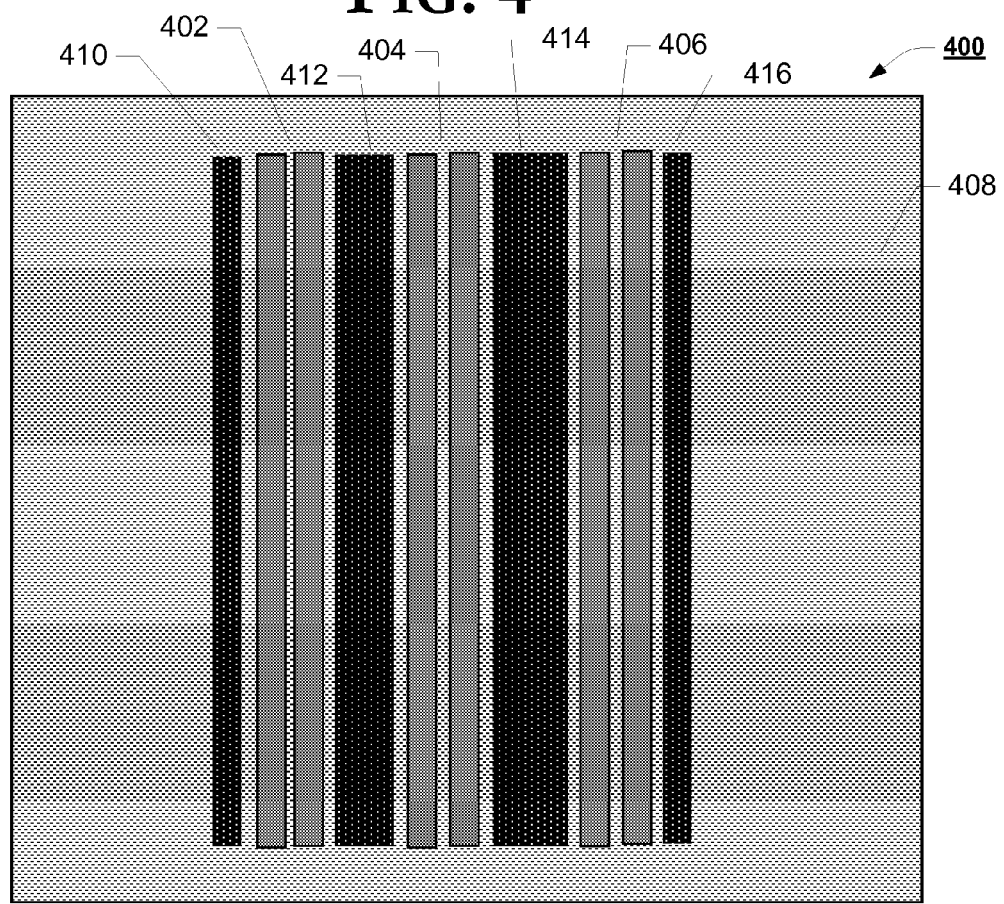
FIG. 4 is a graphical illustration of a plan view of an example multi-pair differential line common mode filtering, in accordance with one example embodiment of the invention.

FIG. 4 is a graphical illustration of a plan view of an example multi-pair differential line common mode filtering, in accordance with one example embodiment of the invention. As shown, system 400 includes differential pairs 402, 404, and 406, printed circuit board 408, and filter portions 410, 412, 414, and 416. Other components of system 400, for example transmitting and receiving devices, are not shown.

Figure 5:
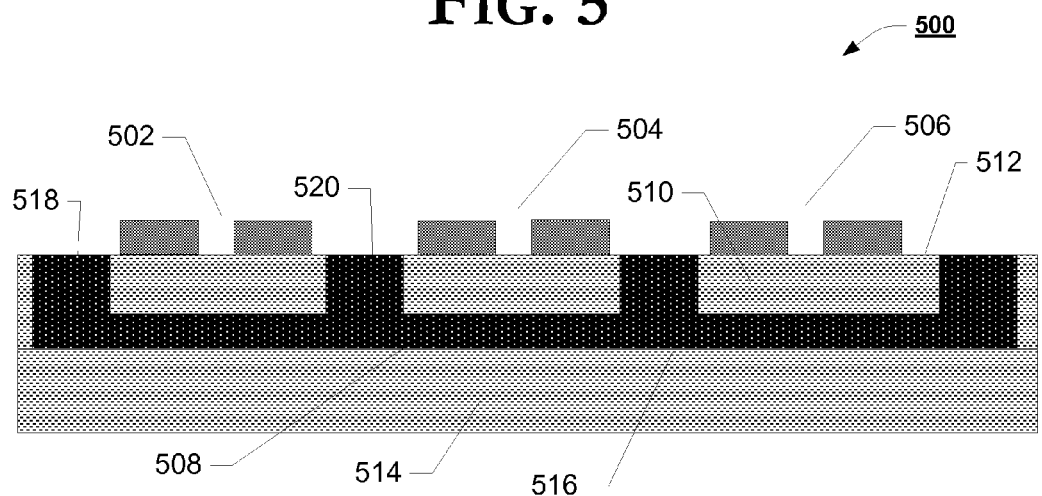
FIG. 5 is a graphical illustration of a cross-sectional view of an example multi-pair differential line common mode filtering, in accordance with one example embodiment of the invention.

Filter portions 410, 412, 414 and 416 may extend to the surface of printed circuit board 408 and may be connected to one another below the surface of printed circuit board 408, for example as shown in FIG. 5, in one embodiment, filter portions 410, 412, 414 and 416 comprise a dielectric material different than a predominantly occurring dielectric material of printed circuit board 408. In one embodiment, filter portions 410, 412, 414 and 416 comprise magnetic or conductive lossy material, such as, for example ferrite.

FIG. 5 is a graphical illustration of a cross-sectional view of an example multi-pair differential line common mode filtering, in accordance with one example embodiment of the invention. As shown, system 500 includes differential pairs 502, 504, and 506, common mode filter 508, first PCB layer 510, first PCB layer top surface 512, second PCB layer 514, second PCB layer top surface 516 lateral filter portions 518, and between-pair filter portions 520.

As shown, lateral filter portions 518 (outside differential pairs 502, 504 and 506) and between-pair filter portions 520 (between differential pairs 502, 504 and 506) extend to first PCB layer top surface 512, however this is not necessary in all embodiments. For example, in some embodiments, common mode filter 508 may be formed partly or entirely below second PCB layer top surface 516. In some embodiments, common mode filter 508 comprises a dielectric material different than a predominantly occurring dielectric material of second PCB layer 514. While differentials pairs 502, 504 and 506 are shown on first PCB layer top surface 512, differential pairs 502, 504 and 506 may be under first PCB layer top surface 512 or on or under another layer of system 500 or another layer not shown.

Figure 6:
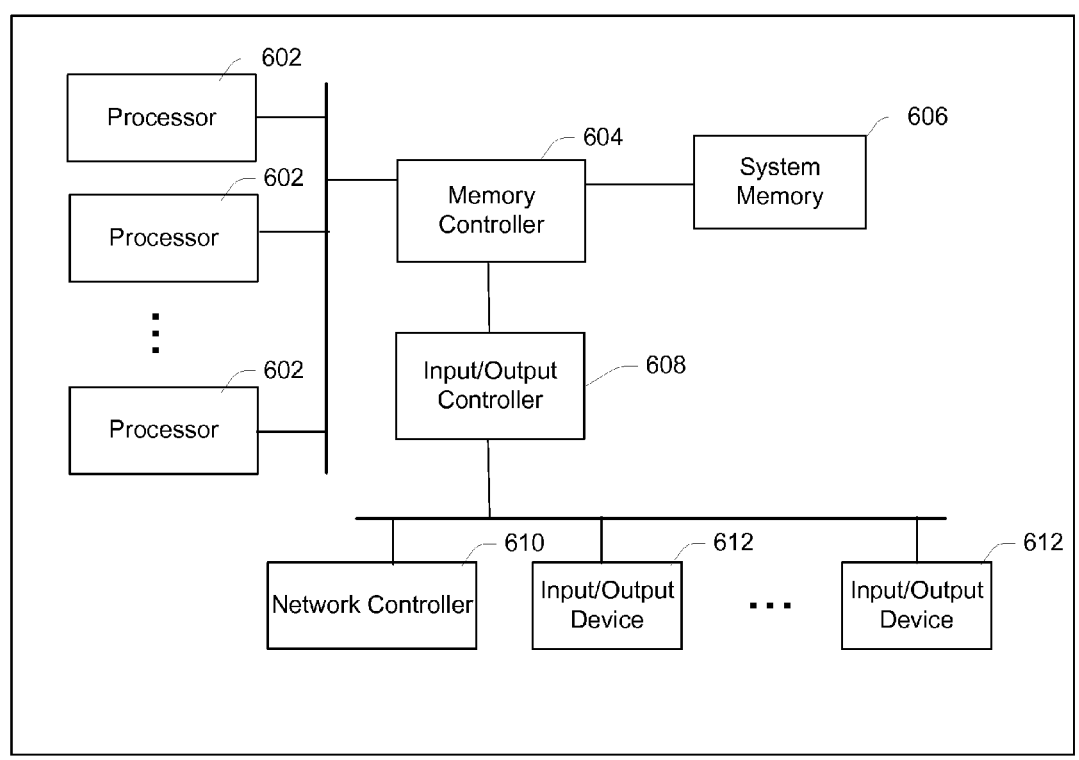
FIG. 6 is a block diagram of an example electronic appliance suitable for multi-pair differential line common mode filtering, in accordance with one example embodiment of the invention.

FIG. 6 is a block diagram of an example electronic appliance suitable for multi-pair differential line common mode filtering, in accordance with one example embodiment of the invention. Electronic appliance 600 is intended to represent any of a wide variety of traditional and non-traditional electronic appliances, laptops, cell phones, wireless communication subscriber units, personal digital assistants, or any electric appliance that would benefit from the teachings of the present invention. In accordance with the illustrated example embodiment, electronic appliance 600 may include one or more of processor(s) 602, memory controller 604, system memory 606, input/output controller 608, network controller 610, and input/output device(s) 612 coupled as shown in FIG. 6. Electronic appliance 600 may include connections between components that include differential pairs and multi-pair differential line common mode filtering described previously as an embodiment of the present invention.

Processor(s) 602 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 602 are Intel® compatible processors. Processor(s) 602 may have an instruction set containing a plurality of machine level instructions that may be invoked, for example by an application or operating system.

Memory controller 604 may represent any type of chipset or control logic that interfaces system memory 606 with the other components of electronic appliance 600. In one embodiment, the connection between processor(s) 602 and memory controller 604 may be a high speed/frequency serial link including one or more differential pairs. In another embodiment, memory controller 604 may be incorporated into processor(s) 602 and differential pairs may directly connect processor(s) 602 with system memory 606.

System memory 606 may represent any type of memory device(s) used to store data and instructions that may have been or will be used by processor(s) 602. Typically, though the invention is not limited in this respect, system memory 606 will consist of dynamic random access memory (DRAM). In one embodiment, system memory 606 may consist of Rambus DRAM (RDRAM). In another embodiment, system memory 606 may consist of double data rate synchronous DRAM (DDRSDRAM).

Input/output (I/O) controller 608 may represent any type of chipset or control logic that interfaces I/O device(s) 612 with the other components of electronic appliance 600. In one embodiment, I/O controller 608 may be referred to as a south bridge. In another embodiment, I/O controller 608 may comply with the Peripheral Component Interconnect (PCI) Express™ Base Specification, Revision 1.0a, PCI Special Interest Group, released Apr. 15, 2003.

Network controller 610 may represent any type of device that allows electronic appliance 600 to communicate with other electronic appliances or devices. In one embodiment, network controller 610 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 610 may be an Ethernet network interface card.

Input/output (I/O) device(s) 612 may represent any type of device, peripheral or component that provides input to or processes output from electronic appliance 600.

It is to be understood that even though numerous characteristics and advantages of various embodiments of the present invention have been set forth in the foregoing description, together with details of the structure and function of various embodiments of the invention, this disclosure is illustrative only. In some cases, certain subassemblies are only described in detail with one such embodiment. Nevertheless, it is recognized and intended that such subassemblies may be used in other embodiments of the invention. Changes may be made in detail, especially matters of structure and management of parts within the principles of the embodiments of the invention to the full extent indicated by the broad general meaning of the terms in which the appended claims are expressed.

Having disclosed exemplary embodiments and the best mode, modifications and variations may be made to the disclosed embodiments while remaining within the scope of the embodiments of the invention as defined by the following claims.

What is claimed is:

1. An apparatus comprising:
   a multi-layer printed circuit board including a first dielectric material, wherein the first dielectric material is a most predominant of any dielectric materials of the multi-layer printed circuit board;
   a first signal line and a second signal line forming a first differential pair on a first layer of the printed circuit board;
   a second differential pair on the first layer of the printed circuit board; and
   a common mode filter on a second layer of the printed circuit board, wherein all of the first dielectric material is external to the common mode filter, wherein the common mode filter extends directly below a portion of the first differential pair and further extends directly below portion of the second differential pair.

2. The apparatus of claim 1, wherein the common mode filter comprises a void on the second layer directly below an area between the first differential pair and the second differential pair.

3. The apparatus of claim 1, wherein the common mode filter comprises a magnetic lossy material.

4. The apparatus of claim 1, wherein the common mode filter comprises a conductive lossy material.

5. The apparatus of claim 1, further comprising a third differential pair on the first layer of the printed circuit board above the common mode filter, the third differential pair adjacent to the first differential pair and the second differential pair.

6. The apparatus of claim 1, wherein the first layer of the printed circuit board comprises a surface level.

7. The apparatus of claim 6, wherein the common mode filter comprises dielectric material extending up to the surface level in an area between the first differential pair and the second differential pair.

8. The apparatus of claim 1, wherein the second layer of the printed circuit board comprises a power plane.

9. An apparatus comprising:
   an integrated circuit device on a multi-layer printed circuit board including a first dielectric material, wherein the first dielectric material is a most predominant of any dielectric materials of the multi-layer printed circuit board;
   a first differential pair coupled with the integrated circuit device, the differential pair on a first layer of the printed circuit board;
   a second differential pair coupled with the integrated circuit device, the second differential pair substantially parallel to the first differential pair on the first layer of the printed circuit board; and
   a common mode filter on a second layer of the printed circuit board, wherein all of the first dielectric material is external to the common mode filter, wherein the common mode filter extends directly below a portion of the first differential pair and further extends directly below a portion of the second differential pair.

10. The apparatus of claim 9, wherein the common mode filter further comprises a void on the second layer directly below an area between the first differential pair and the second differential pair.

11. The apparatus of claim 9, wherein the common mode filter comprises a magnetic lossy material.

12. The apparatus of claim 9, wherein the common mode filter comprises a conductive lossy material.

13. The apparatus of claim 9, wherein the common mode filter further comprises dielectric material extending up to the first layer of the printed circuit board in an area between the first differential pair and the second differential pair.

14. The apparatus of claim 9, wherein the second layer of the printed circuit board comprises a ground plane.

* * * * *